United States Patent
Krassnitzer et al.

(10) Patent No.: US 9,934,951 B2
(45) Date of Patent: Apr. 3, 2018

(54) TARGET ADAPTED TO AN INDIRECT COOLING DEVICE

(71) Applicant: Oerlikon Surface Solutions AG, Trubbach, Trubbach (CH)

(72) Inventors: Siegfried Krassnitzer, Feldkirch (AT); Juerg Hagmann, Sax (CH)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 0 days.

(21) Appl. No.: 14/390,828

(22) PCT Filed: Mar. 5, 2013

(86) PCT No.: PCT/EP2013/000623
§ 371 (c)(1),
(2) Date: Oct. 6, 2014

(87) PCT Pub. No.: WO2013/149692
PCT Pub. Date: Oct. 10, 2013

(65) Prior Publication Data
US 2015/0060261 A1    Mar. 5, 2015

(30) Foreign Application Priority Data

Apr. 4, 2012    (DE) .................. 10 2012 006 717

(51) Int. Cl.
*H01J 37/34*    (2006.01)
*C23C 14/34*    (2006.01)
(Continued)

(52) U.S. Cl.
CPC ........... *H01J 37/3497* (2013.01); *C09J 7/026* (2013.01); *C23C 14/34* (2013.01);
(Continued)

(58) Field of Classification Search
CPC .. C23C 14/3407; C23C 14/54; H01J 37/3414; H01J 37/3417; H01J 37/3435;
(Continued)

(56) References Cited

U.S. PATENT DOCUMENTS 5,071,535 A * 12/1991 Hartig ................. C23C 14/3407
                                                      204/298.09
5,244,556 A *  9/1993 Inoue .................. C23C 14/3407
                                                      204/192.12
(Continued)

FOREIGN PATENT DOCUMENTS

DE   195 35 894 A1   4/1997
EP    0 512 456 A1  11/1992
(Continued)

OTHER PUBLICATIONS

International Search Report for PCT/EP2013/000623, dated Jun. 18, 2013.

*Primary Examiner* — Michael A Band
(74) *Attorney, Agent, or Firm* — Pearne & Gordon LLP

(57) ABSTRACT

The invention relates to a target which is embodied as a material source for a depositing method from the gas phase, comprising a front side and a rear side, characterized in that a self-adhesive carbon film is applied to the rear side. Said target can be embodied as a material source for a sputtering method and/or for an arc evaporation method. A particular advantage is that the target is used in a coating source with indirect cooling, the self-adhesive carbon film being in contact with the surface of the membrane which is part of a cooling channel.

12 Claims, 4 Drawing Sheets

(51) Int. Cl.
    *C23C 14/54*        (2006.01)
    *C09J 7/02*         (2006.01)
(52) U.S. Cl.
    CPC .......... *C23C 14/3407* (2013.01); *C23C 14/54*
        (2013.01); *H01J 37/3411* (2013.01); *H01J*
        *37/3417* (2013.01); *H01J 37/3435* (2013.01);
        *H01J 2237/002* (2013.01)
(58) Field of Classification Search
    CPC .............. H01J 37/3497; H01J 37/3411; H01J
                                        34/3497; C09J 7/026
    See application file for complete search history.

(56) References Cited

U.S. PATENT DOCUMENTS

| | | | | |
|---|---|---|---|---|
| 5,421,978 | A | * | 6/1995 | Schuhmacher ..... C23C 14/3407 204/298.09 |
| 6,039,855 | A | | 3/2000 | Wollenberg |
| 2010/0252418 | A1 | * | 10/2010 | McCabe ............. C23C 14/3407 204/192.15 |

FOREIGN PATENT DOCUMENTS

| | | | | | |
|---|---|---|---|---|---|
| GB | | 2173217 A | * | 10/1986 | ......... C23C 14/3407 |
| JP | | 09125560 A | * | 5/1997 | |

\* cited by examiner

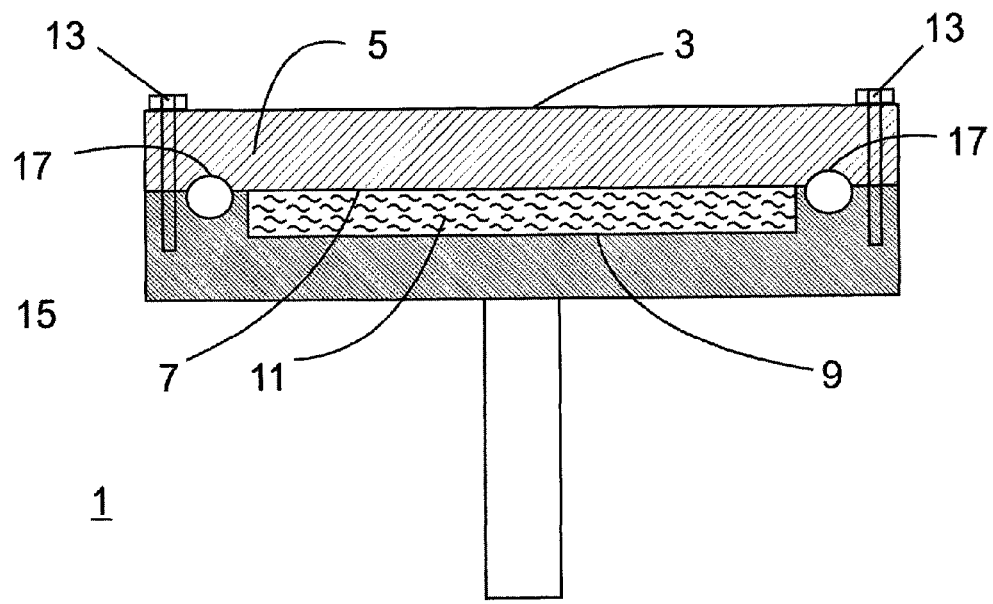
Figure 1 - PRIOR ART -
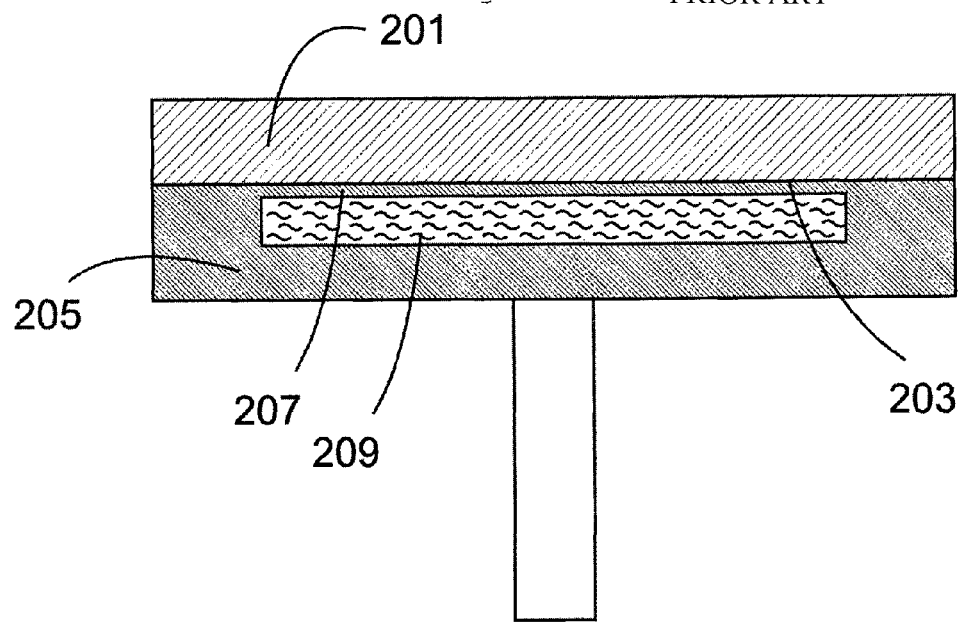
Figure 2 - PRIOR ART -

401

TARGET ADAPTED TO AN INDIRECT COOLING DEVICE

The present invention relates to a target whose surface serves as material source in the framework of a PVD method, in particular under vacuum conditions. The invention relates in particular to such targets that are used for sputtering (hereinafter the term "sputtering" is used as synonym with the PVD method of spray deposition coating). In practice, such a target is usually held by a source holder, in which means for cooling the target are provided. The invention relates in particular to a coating source that comprises such a target.

During sputtering, the surface of a target is bombarded with ions under vacuum conditions. The bombarding causes material to be ejected from the target surface and then deposited on the substrates provided for this purpose and paced in the field of sight of the target surface. The ions used to this effect are provided by a plasma built over the target surface. By applying a negative voltage on the target, the ions are accelerated towards the latter. The more ions flowing per time unit, the higher the coating rate. The higher the voltage applied to the target, the higher the impact speed of the ions on the target surface and thus the higher the energy of the sputtered material ejected from the target. A high power input is thus desirable, Furthermore, dependencies between the degree of ionization of the sputtered material and the power density are known. These effects are used in the HiPIMS (high-power impulse magnetron sputtering) process.

The average power density that is applied to such a sputter target is generally in the range of 5 W/cm$^2$ to 30 W/cm$^2$.

Sputtering, however, is a PVD coating method with low energy efficiency. This means that a great proportion of the energy available is converted in the target into heat and the target warms up. This heat must be evacuated by means of a cooling system. In this respect, the state of the art suggests several approaches that will be briefly outlined hereafter.

a) Directly Cooled Target

In the case of a directly coded target 1 as represented schematically in FIG. 1, the output converted into heat at the target surface 3 is directed to the target rear side 7 by means of thermal conduction in the target material 5. The cooling liquid 11 flowing in a water channel 9 can evacuate the heat flow according to its thermal capacity and the flow conditions. There is a very good direct thermal contact between the target rear side 7 and the cooling liquid 11. In this case, however, it is necessary to fasten the target e.g. by means of screws 13 to the base body 15. Furthermore, a seal 17 must be provided for sealing the vacuum with respect to the cooling liquid 11, for example water. Electric supply lines 6 are furthermore outlined in FIG. 1. Otherwise, the drawing is merely a schematic drawing Further components, for example for generating vacuum, insulation, feeding and evacuation of the cooling liquid, are known to the experts and their representation is omitted here.

Although this directly coded target is appealing because of its good cooling properties, it has decisive disadvantages because of the cooling liquid-vacuum seal and the necessary releasing of the water-target connection when changing the target. There is for example the risk of generating cooling liquid leaks. This risk is particularly high when the target material needs to be switched often.

b) Indirectly Cooled Target

In an indirectly cooled target, as represented in FIG. 2, the target 201 is fastened on its rear side 203 to a source holder 205 (e.g. screwed or damped), wherein a self-contained cooling plate 207 is integrated in the source holder 205. The cooling plate 207 comprises For example a cooling channel 209 in which flows a cooling agent; heat is evacuated through the moving liquid.

In this case, the cooling liquid channel is limited by means of a massive fixed cover. For the purpose of cooling and electric contact, the target is fastened to this cover for example with screws on the periphery or possibly in the middle of the target. This method results among others in two problems:

The thermal bridge is formed by the surface of the target rear side and the surface of the cooling plate, Without specific measures, these two surfaces form a boundary surface that differs strongly from an ideal smooth contact pairing. Such a situation is represented in FIG. 3. The thermal bridge in this case is strongly reduced and proves dependent on pressure. Contact pressure can however for example be initiated only through the fastening screws, i.e. the thermal bridge can be improved only locally.

This situation can be improved by providing a contact film between the two surfaces, This can be e.g. of indium, pewter or graphite. Thanks to their ductility, these films can compensate for unevenness between the target rear side and the surface of the cooling plate. Furthermore, the contact pressure can be applied more evenly over the surface.

One disadvantage of this method is that mounting a contact film, in particular in the case of vertically mounted targets, is difficult and laborious. This is particularly relevant if the target material is to be switched often. In the case of graphite films, although the lateral thermal conductivity is good, the transverse thermal conductivity conversely is bad. Graphite films must therefore on the one hand be thin, so that their poor transverse thermal conductivity does not impede the cooling process. On the other hand, a certain thickness of the film is required to prevent the film from being damaged during the mounting process. Graphite films with a thickness not below 0.5 mm are therefore used.

There is therefore a need for an improved cooling device for targets that improves in particular the switching of the target material as compared with the devices known from the state of the art.

The invention is based on a further development of the indirect cooling device outlined above. According to the invention, the task is solved in that on the rear side of the target body, a self-adhesive carbon film is applied in a tight bond with the target body. The film can be glued to the rear side of the target body evenly and without gaps while the target body is not mounted. A very good thermal contact between the rear side of the target body and the carbon film is thus ensured. The target body can then be mounted onto the source holder in a simple manner. The carbon film fixed onto the target then has the effect of a contact sheet between the surface of the cooling plate and the rear side of the target body.

The use of such a self-adhesive carbon film is not usual in the field of vacuum technology. Since the glues used for producing the self-adhesive carbon film outgas strongly under vacuum conditions and thus have a negative impact on the vacuum and result in the corresponding volatile components contaminating the substrates to be processed under vacuum, such substances are not used.

In contrast thereto, the inventors have observed to their surprise that the self-adhesive films, when used as described above, do not noticeably have the outlined negative effects. One explanation in this connection could be that because of the dose contact to the rear side of the target surface and because of the contact of the carbon film to the membrane, an outgassing of the adhesive substance is considerably decreased and thus not relevant.

The invention will now be described in detail with the aid of the figures and on the basis of different exemplary embodiments.

FIG. 1 shows a conventional coating source with direct cooling.

FIG. 2 shows a conventional coating source with indirect cooling.

Figure 3:
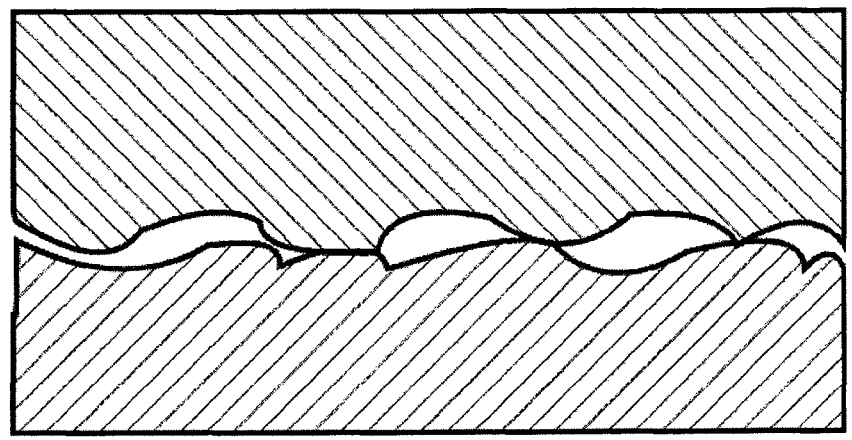
FIG. 3 shows the limited thermal contact in the case of a coating source with cooling according to FIG. 2.
Figure 4:
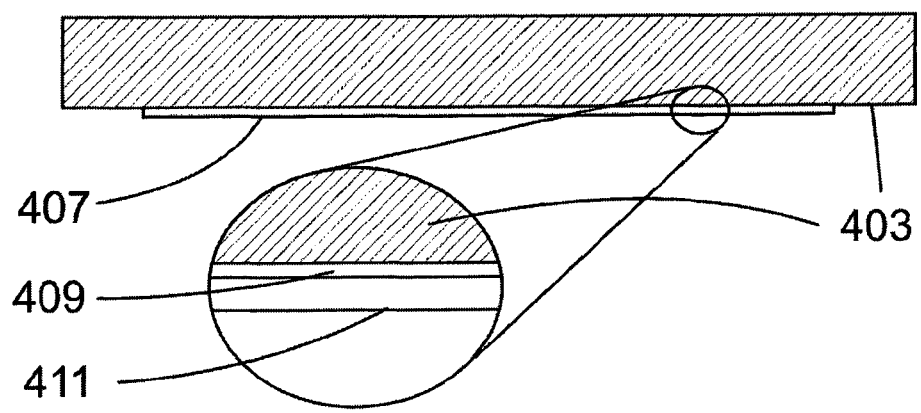
FIG. 4 shows in cross section an embodiment of the inventive target with applied self-adhesive carbon film.

Accordingly, FIG. 4 shows a target 401 onto whose target rear side 403 a one-sided self-adhesive carbon film 407 with a thickness between 0.1 mm and less than 0.5 mm is applied. The preferred thickness, chosen in the example, for the carbon film is 0.125 mm. In the example, a contact film of the company Kunze with product identification number KU-CB1205-AV was used.

Also shown in FIG. 4 is a more precise section of the boundary surface between the target rear side and the self-adhesive carbon film. The carbon film in this respect comprises an adhesive film 409 that renders the carbon film self-adhesive, as well as a carbon film 411.

Figure 5:
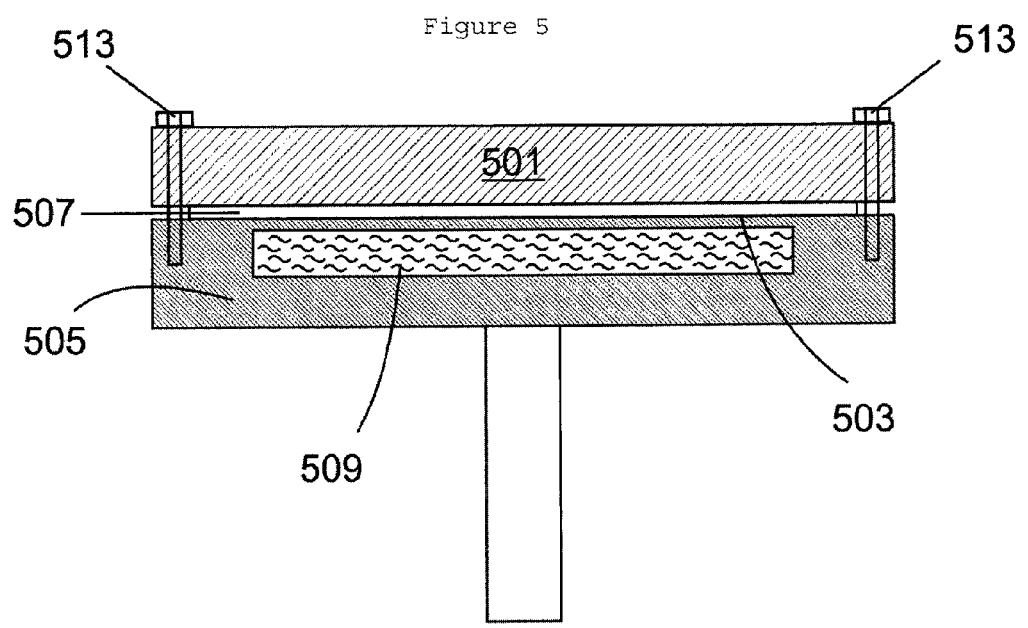
FIG. 5 shows the inventive target integrated in a coating source with indirect cooling in a first embodiment.

The target according to FIG. 4 can be easily integrated in a coating source with indirect cooling, as shown in FIG. 5: the target 501 with self-adhesive carbon film 507 is fastened by means of screws 513 to the front side of a source holder 505, wherein a cooling plate with a cooling channel 509 is integrated in the source holder and the carbon film 507 is pressed onto the rear side 503 of the cooling plate, whereby a good thermal contact to the cooling plate is generated. Due to the inventive fact that the carbon film is glued on the target rear side, switching the targets is very easy, even if the target is mounted vertically in a coating chamber.

Figure 6:
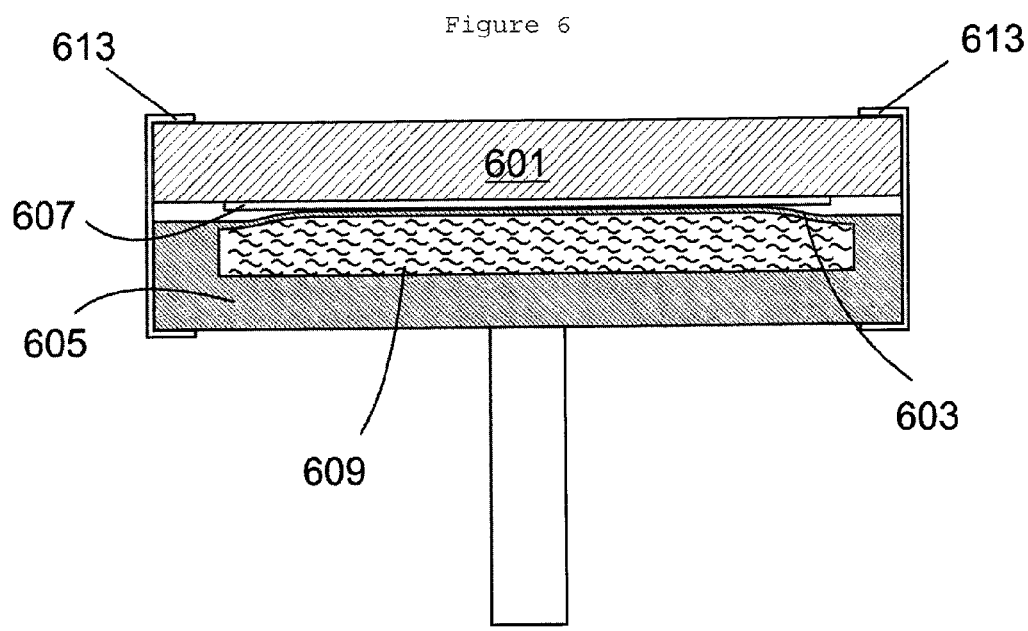
FIG. 6 shows the inventive target integrated in a coating source in a second embodiment.

An improved variant embodiment of indirect cooling is indirect cooling by means of a movable membrane, as shown in FIG. 6. The structure is similar to that outlined in FIG. 5, with a target 601 with a self-adhesive carbon film 607, a source holder 605, a cooling channel 609, wherein however the wall of the cooling plate that separates the cooling channel 609 from the carbon film 607 in this preferred embodiment is executed as a flexible membrane 603. The cooling means can be for example water. When switching the targets, it is not necessary to unlock a water seal. If the target 601 is fastened on the source holder 605 by means of suitable measures (e.g. by means of brackets 613 or screws), the hydrostatic pressure prevailing in the cooling channel 609 will press the membrane 603 uniformly to the target rear side and thus to the self-adhesive carbon film 607 and this results in a very good, extensive thermal contact.

The fact that the self-adhesive carbon film plays an essential role is documented impressively by the following table 1, in which the target temperature with and without self-adhesive carbon film is compared for different sputter outputs and two different material compositions:

TABLE 1

| No | Target type | Carbon film | Sputter output | Target temperature |
|---|---|---|---|---|
| 1 | AlCr (70:30 at %) | no | 5 KW | 235° C. |
| 2 | AlCr (70:30 at %) | yes | 5 KW | 132° C. |
| 3 | AlCr (70:30 at %) | yes | 7.5 KW | 171° C. |
| 4 | AlCr (70:30 at %) | yes | 10 KW | 193° C. |
| 5 | AlTi (67:33 at %) | yes | 5 KW | 138° C. |
| 6 | AlTi (67:33 at %) | yes | 7.5 KW | 182° C. |

For mechanical reasons, a target without inventive self-adhesive carbon film as in measurement 1 of table 1 can be operated safely only to a sputter output of 2.5 kW. By using an inventive target with self-adhesive carbon the output tolerance is more than doubled.

In the case of other target materials, i.e. for other ratios of AlTi resp. AlCr as well as in the case of pure aluminum, titanium and/or chromium targets, the situation is similar in terms of quality. The present invention has a particularly good effect if target thicknesses between 6 mm and 18 mm are used. The target thickness is preferably between 6 mm and 12 mm.

Figure 7:
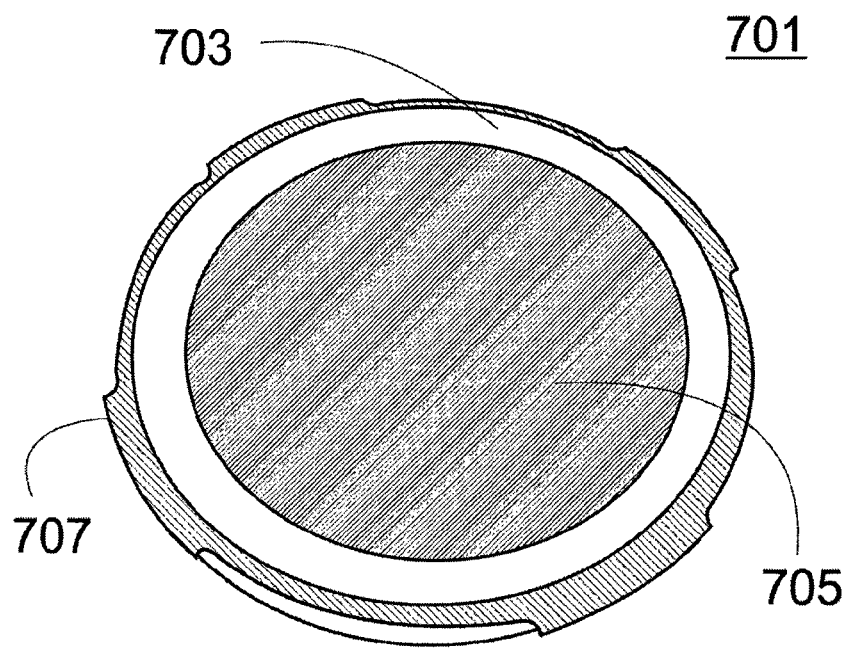
FIG. 7 shows the inventive target with bayonet profiling.

According to a particularly preferred embodiment of the present invention, the target 701 is embodied as a target with self-adhesive carbon film 705 on the target rear side 703 and bayonet profiling 707 according to FIG. 7. A preferred coating source according to this embodiment has the indirect cooling with membrane described in the context of FIG. 6 and the required counterparts for the bayonet fastening. In this way, a high and homogenous contact pressure can be achieved. This preferred embodiment is of particular advantage especially in connection with powder-metallurgical targets, since the latter become mechanically weakened above a temperature of 150° C. and the thermal expansion rises. Due to the reduction in temperature and the mechanical tolerance provided by the bayonet fastening, this thermal stress is considerably reduced. For chromium targets, for example, power densities up to 100 W/cm$^2$ are possible.

A target has been disclosed that is embodied as a material source for a deposition process from the gas phase, with a front side and a rear side, characterized in that a self-adhesive carbon film is glued onto the rear side. The target can be embodied as material source for a sputtering process and/or for a spark evaporation process. The thickness of the self-adhesive carbon film can be for example between 0.125 mm and 0.5 mm and preferably have a thickness of 0.125 mm.

A coating source comprising a target as described above has been disclosed that is placed on a source holder into which an indirect cooling with cooling channel is integrated.

In the coating source, the one wall that separates the cooling channel from the self-adhesive carbon film is preferably executed as flexible membrane, whereby the self-adhesive carbon film forms an extensive contact with the membrane.

The perimeter of the target of the coating source is preferably designed such that it cooperates with the source holder in the form of a bayonet joint, whereby a high and homogenous contact pressure is achieved.

In the case of an indirectly cooled coating source it would also be possible to glue the self-adhesive carbon film to that wall which separates the cooling channel from the rear side of a target. This also applies if this wall is embodied as a membrane. This would however have the disadvantage that in case the film becomes damaged, it would have to be laboriously removed from the source holder and replaced. If the self-adhesive carbon film is sufficiently thin, it is also possible to apply it both to the target rear side and also to that one wall that separates the cooling channel from the rear side of the target.

What is claimed is:

1. Method for coating substrates, the method comprising the steps of:
   placing a coating source on a source holder; and
   depositing a layer by a sputtering process using the coating source,
   wherein the coating source comprises a metal target (601, 701) and a self-adhesive carbon film, the metal target (601), (701) having a front side and a rear side,
   wherein the layer is deposited by using the coating source comprising the metal target (601, 701), whose rear side is placed on one wall of the source holder (605) into which an indirect cooling with a cooling channel (609) is integrated, wherein the metal target (601, 701) is fastened onto the source holder (605) through suitable measures and the one wall of the source holder (605) onto which the metal target (601, 701) is fastened is executed as a flexible membrane (603), which separates the cooling channel (609) from the rear side of the metal target (601, 701), the coating source characterized in that the self-adhesive carbon film (607, 705) comprises a carbon film having an adhesive film on one side of the carbon film, wherein the self-adhesive carbon film is adhered directly to the metal target and the adhesive film is positioned between the carbon film and the metal target, and
   wherein the self-adhesive carbon film (607, 705) is adhered in such a manner that when the flexible membrane (603) is pressed uniformly on the rear side of the metal target (601, 701) during the sputtering process due to a hydrostatic pressure prevailing in the cooling channel (609), the metal target (601, 701) is also pressed onto the self-adhesive carbon film (607, 705) in such a manner that thermal contact between the flexible membrane (603) and the rear side of the metal target (601, 701) results, which enables the temperature of the metal target (601, 701) to be held so low that an output tolerance of the metal target (601, 701) with the self-adhesive carbon film (607, 705), as compared with the output tolerance of the same metal target in the same coating source but without self-adhesive carbon film (607, 705), is at least doubled.

2. Method according to claim 1, characterized in that the temperature of the metal target is held below 200° C.

3. Method according to claim 2, characterized in that a sputtering output at the metal target of up to 10 kW is used.

4. Method according to claim 1, characterized in that a target power density of up to 100 W/cm$^2$ is used.

5. Method according to claim 1, characterized in that the used metal target is an AlTi, AlCr, Al, Ti, TiCr or Cr target.

6. Method according to claim 1, wherein a thickness of the metal target (601, 701) is between 6 mm and 18 mm.

7. Method according to claim 1, wherein the metal target (601, 701) is produced by a powder-metallurgical process.

8. Method according to claim 1, wherein the thickness of the self-adhesive carbon film (607, 705) is 0.125 mm.

9. Method according to claim 6, wherein the thickness of the metal target (601, 701) is between 6 mm to 12 mm.

10. Method for coating substrates, the method comprising steps of:
    placing a coating source on a source holder; and
    depositing a layer by a sputtering process using the coating source,
    wherein the coating source comprises a metal target (601, 701) and a self-adhesive carbon film, the metal target (601), (701) having a front side and a rear side,
    wherein the layer is deposited by using the coating source comprising the metal target (601, 701), whose rear side is placed on one wall of the source holder (605) into which an indirect cooling with a cooling channel (609) is integrated, wherein the metal target (601, 701) is fastened onto the source holder (605) through suitable measures and the one wall of the source holder (605) onto which the metal target (601, 701) is fastened is executed as a flexible membrane (603), which separates the cooling channel (609) from the rear side of the metal target (601, 701), the coating source characterized in that the self-adhesive carbon film (607, 705) comprises a carbon film having an adhesive film on one side of the carbon film, wherein the self-adhesive carbon film is adhered directly to the metal target and the adhesive film is positioned between the carbon film and the metal target,
    wherein the metal target with the self-adhesive carbon film has an output tolerance more than doubled in comparison with the metal target without the self-adhesive carbon film.

11. Method according to claim 1, wherein the thickness of the self-adhesive carbon film (607, 705) is between 0.1 mm and 0.5 mm.

12. Method according to claim 10, wherein the thickness of the self-adhesive carbon film (607, 705) is between 0.1 mm and 0.5 mm.

* * * * *